US009063431B2

(12) United States Patent
Barnes et al.

(10) Patent No.: US 9,063,431 B2
(45) Date of Patent: Jun. 23, 2015

(54) AQUEOUS CLEANER FOR THE REMOVAL OF POST-ETCH RESIDUES

(75) Inventors: Jeffrey A. Barnes, Bethlehem, CT (US); Steven Lippy, Danbury, CT (US); Peng Zhang, Montvale, NJ (US); Rekha Rajaram, White Plains, NY (US)

(73) Assignee: ADVANCED TECHNOLOGY MATERIALS, INC., Danbury, CT (US)

( * ) Notice: Subject to any disclaimer, the term of this patent is extended or adjusted under 35 U.S.C. 154(b) by 28 days.

(21) Appl. No.: 13/810,060

(22) PCT Filed: Jul. 15, 2011

(86) PCT No.: PCT/US2011/044191
§ 371 (c)(1),
(2), (4) Date: Jul. 29, 2013

(87) PCT Pub. No.: WO2012/009639
PCT Pub. Date: Jan. 19, 2012

(65) Prior Publication Data
US 2013/0296214 A1  Nov. 7, 2013

Related U.S. Application Data

(60) Provisional application No. 61/365,034, filed on Jul. 16, 2010.

(51) Int. Cl.
*G03F 7/42* (2006.01)
*C11D 3/06* (2006.01)
*C11D 3/26* (2006.01)
*C11D 3/36* (2006.01)
*H01L 21/02* (2006.01)

(52) U.S. Cl.
CPC .............. *G03F 7/42* (2013.01); *H01L 21/02063* (2013.01); *H01L 21/02071* (2013.01)

(58) Field of Classification Search
CPC ..... G03F 7/42; H01L 21/02041; C11D 3/042; C11D 3/06; C11D 3/245; C11D 3/26; C11D 3/36
USPC ......... 510/175, 176, 178, 465, 467, 499, 500, 510/505; 134/1.1, 2, 3, 41, 42
See application file for complete search history.

(56) References Cited

U.S. PATENT DOCUMENTS

| 5,320,709 | A | 6/1994 | Bowden et al. |
| 5,417,877 | A | 5/1995 | Ward |
| 5,512,202 | A | 4/1996 | Borah |
| 5,571,447 | A | 11/1996 | Ward et al. |
| 5,672,577 | A | 9/1997 | Lee |
| 5,698,503 | A | 12/1997 | Ward et al. |
| 6,211,126 | B1 | 4/2001 | Wojtczak et al. |
| 6,224,785 | B1 | 5/2001 | Wojtczak et al. |
| 6,280,651 | B1 | 8/2001 | Wojtczak et al. |
| 6,326,130 | B1 | 12/2001 | Schwartzkopf et al. |
| 6,344,432 | B1 | 2/2002 | Wojtczak et al. |
| 6,492,310 | B2 | 12/2002 | Wojtczak et al. |
| 6,566,315 | B2 | 5/2003 | Wojtczak et al. |
| 6,599,370 | B2 | 7/2003 | Skee |
| 6,755,989 | B2 | 6/2004 | Wojtczak et al. |
| 6,773,873 | B2 | 8/2004 | Seijo et al. |
| 6,849,200 | B2 | 2/2005 | Baum et al. |
| 6,875,733 | B1 | 4/2005 | Wojtczak et al. |
| 6,896,826 | B2 | 5/2005 | Wojtczak et al. |
| 7,534,752 | B2 | 5/2009 | Wojtczak et al. |
| 7,922,824 | B2 | 4/2011 | Minsek et al. |
| 7,960,328 | B2 | 6/2011 | Visintin et al. |
| 8,058,219 | B2 | 11/2011 | Rath et al. |
| 2002/0019128 | A1 | 2/2002 | Lee et al. |
| 2004/0149309 | A1 | 8/2004 | Hsu |
| 2004/0180300 | A1 | 9/2004 | Minsek et al. |
| 2005/0197265 | A1 | 9/2005 | Rath et al. |
| 2006/0063687 | A1 | 3/2006 | Minsek et al. |
| 2006/0148666 | A1 | 7/2006 | Peters et al. |
| 2006/0154186 | A1 | 7/2006 | Minsek et al. |
| 2006/0154839 | A1 | 7/2006 | Ilardi et al. |
| 2006/0199749 | A1 | 9/2006 | Suzuki et al. |
| 2007/0251551 | A1 | 11/2007 | Korzenski et al. |
| 2008/0076688 | A1 | 3/2008 | Barnes et al. |
| 2008/0125342 | A1 | 5/2008 | Visintin et al. |

(Continued)

FOREIGN PATENT DOCUMENTS

| WO | 03006599 A1 | 1/2003 | |
| WO | 2004094581 A1 | 11/2004 | |
| WO | 2005017230 A1 | 2/2005 | |
| WO | 2005057281 A2 | 6/2005 | |
| WO | 2006110645 A2 | 10/2006 | |
| WO | 2006113222 A2 | 10/2006 | |
| WO | 2007027522 A2 | 3/2007 | |
| WO | WO 2008/080097 | * 7/2008 | ............. C11D 11/00 |
| WO | 2008157345 A2 | 12/2008 | |
| WO | 2009073596 A2 | 6/2009 | |
| WO | 2010017160 A2 | 2/2010 | |
| WO | 2010048139 A2 | 4/2010 | |
| WO | 2010086745 A1 | 8/2010 | |
| WO | 2010091045 A2 | 8/2010 | |
| WO | 2012097143 A2 | 7/2012 | |

OTHER PUBLICATIONS

International Search Report, Feb. 21, 2012.
Japanese Office Action, Feb. 15, 2012.
Chinese Office Action, Feb. 12, 2015.

*Primary Examiner* — Brian P Mruk
(74) *Attorney, Agent, or Firm* — Tristan A. Fuierer; Moore & Van Allen, PLLC; Rosa Yaghamour

(57) ABSTRACT

Cleaning compositions and processes for cleaning post-plasma etch residue from a microelectronic device having said residue thereon. The composition achieves highly efficacious cleaning of the residue material, including titanium-containing, copper-containing, tungsten-containing, and/or cobalt-containing post-etch residue from the microelectronic device while simultaneously not damaging the interlevel dielectric, metal interconnect material, and/or capping layers also present thereon.

20 Claims, No Drawings

(56) References Cited

U.S. PATENT DOCUMENTS

| | | |
|---|---|---|
| 2008/0242574 A1 | 10/2008 | Rath et al. |
| 2009/0032766 A1 | 2/2009 | Rajaratnam et al. |
| 2009/0212021 A1 | 8/2009 | Bernhard et al. |
| 2009/0281016 A1 | 11/2009 | Cooper et al. |
| 2009/0301996 A1 | 12/2009 | Visintin et al. |
| 2010/0065530 A1 | 3/2010 | Walker et al. |
| 2010/0112728 A1 | 5/2010 | Korzenski et al. |
| 2010/0163788 A1 | 7/2010 | Visintin et al. |
| 2010/0176082 A1 | 7/2010 | Cooper et al. |
| 2010/0261632 A1 | 10/2010 | Korzenski et al. |
| 2010/0286014 A1 | 11/2010 | Barnes |
| 2011/0039747 A1 | 2/2011 | Zhou et al. |
| 2011/0117751 A1 | 5/2011 | Sonthalia et al. |
| 2012/0015857 A1 | 1/2012 | Chen et al. |
| 2012/0283163 A1 | 11/2012 | Barnes et al. |

* cited by examiner

AQUEOUS CLEANER FOR THE REMOVAL OF POST-ETCH RESIDUES

CROSS-REFERENCE TO RELATED APPLICATIONS

This application is filed under the provisions of 35 U.S.C. §371 and claims the priority of International Patent Application No. PCT/US11/44191 filed on 15 Jul., 2011 and entitled "Aqueous Cleaner for the Removal of Post-Etch Residues" which claims priority to U.S. Provisional Patent Application No. 61/365,034 filed on 16 Jul. 2010, both of which are hereby incorporated herein by reference in their entireties.

FIELD

The present invention relates to compositions for the removal of post-etch residue, including titanium-containing, copper-containing and/or tungsten-containing post-etch residue, from microelectronic devices and methods of making and using the same.

DESCRIPTION OF THE RELATED ART

Interconnect circuitry in semiconductor circuits consists of conductive metallic circuitry surrounded by insulating dielectric material. In the past, silicate glass vapor-deposited from tetraethylorthosilicate (TEOS) was widely used as the dielectric material, while alloys of aluminum were used for metallic interconnects. Demand for higher processing speeds has led to smaller sizing of circuit elements, along with the replacement of TEOS and aluminum alloys by higher performance materials. Aluminum alloys have been replaced by copper or copper alloys due to the higher conductivity of copper. TEOS and fluorinated silicate glass (FSG) have been replaced by the so-called low-k dielectrics, including low-polarity materials such as organic polymers, hybrid organic/inorganic materials, organosilicate glass (OSG), and carbon-doped oxide (CDO) glass. The incorporation of porosity, i.e., air-filled pores, in these materials further lowers the dielectric constant of the material.

During dual-damascene processing of integrated circuits, photolithography is used to image a pattern onto a device wafer. Photolithography techniques comprise the steps of coating, exposure, and development. A wafer is coated with a positive or negative photoresist substance and subsequently covered with a mask that defines patterns to be retained or removed in subsequent processes. Following the proper positioning of the mask, the mask has directed therethrough a beam of monochromatic radiation, such as ultraviolet (UV) light or deep UV (DUV) light ($\approx$250 nm or 193 nm), to make the exposed photoresist material more or less soluble in a selected rinsing solution. The soluble photoresist material is then removed, or "developed," leaving behind a pattern identical to the mask.

Thereafter, gas-phase plasma etching is used to transfer the patterns of the developed photoresist coating to the underlying layers, which may include hardmask, interlevel dielectric (ILD), and/or etch stop layers. Post-plasma etch residues are typically deposited on the back-end-of-the-line (BEOL) structures and if not removed, may interfere with subsequent silicidation or contact formation. Post-plasma etch residues typically include chemical elements present on the substrate and in the plasma gases. For example, if a TiN hardmask is employed, e.g., as a capping layer over ILD, the post-plasma etch residues include titanium-containing species, which are difficult to remove using conventional wet cleaning chemistries. Moreover, conventional cleaning chemistries often damage the ILD, absorb into the pores of the ILD thereby increasing the dielectric constant, and/or corrode the metal structures. For example, buffered fluoride and solvent-based chemistries fail to completely remove Ti-containing residues, while hydroxylamine-containing and ammonia-peroxide chemistries corrode copper.

In addition to the desirable removal of titanium-containing post-plasma etch residue, additional materials that are deposited during the post-plasma etch process such as polymeric residues on the sidewalls of the patterned device, copper-containing residues in the open via structures of the device, and tungsten-containing residues are also preferably removed. To date, no single wet cleaning composition has successfully removed all of residue material while simultaneously being compatible with the ILD, other low-k dielectric materials, and metal interconnect materials.

The integration of new materials, such as low-k dielectrics, into microelectronic devices places new demands on cleaning performance. At the same time, shrinking device dimensions reduce the tolerance for changes in critical dimensions and damage to device elements. Etching conditions can be modified in order to meet the demands of the new materials. Likewise, post-plasma etch cleaning compositions must be modified. The cleaner should not damage the underlying dielectric material or corrode metallic interconnect materials, e.g., copper, tungsten, cobalt, aluminum, ruthenium, titanium and nitrides and silicides thereof, on the device.

Towards that end, it is an object of the present invention to provide improved compositions for the effective removal of post-plasma etch residue including, but not limited to, titanium-containing residue, polymeric sidewall residue, copper-containing via residue, tungsten-containing residue, and/or cobalt-containing residue from microelectronic devices, said compositions being compatible with ILD, metal interconnect materials, and/or capping layers.

SUMMARY

The present invention generally relates to cleaning compositions and methods of making and using same. One aspect of the invention relates to a composition and process for cleaning post-plasma etch residue from microelectronic devices having said residue thereon, while simultaneously not compromising the metallic and ILD materials on the microelectronic device surface.

In one aspect, an aqueous cleaning composition is described, said composition comprising at least one corrosion inhibitor, water, optionally at least one chelating agent, optionally at least one etchant, optionally at least one passivating agent, and optionally at least one complexing agent. The aqueous cleaning composition is suitable for cleaning post-plasma etch residue from a microelectronic device having said residue thereon.

In another aspect, an aqueous cleaning composition is described, said composition comprising at least one corrosion inhibitor, water, at least one etchant, at least one passivating agent, optionally at least one chelating agent, and optionally at least one complexing agent. The aqueous cleaning composition is suitable for cleaning post-plasma etch residue from a microelectronic device having said residue thereon.

In yet another aspect, a kit is described, said kit comprising, in one or more containers, one or more of the following reagents for forming an aqueous cleaning composition, said one or more reagents selected from the group consisting of at least one corrosion inhibitor, water, optionally at least one chelating agent, optionally at least one etchant, optionally at least one passivating agent, and optionally at least one complexing agent and wherein the kit is adapted to form an aqueous cleaning composition suitable for cleaning post-plasma etch residue from a microelectronic device having said residue thereon.

In still another aspect, a method of removing material from a microelectronic device having said material thereon is described, said method comprising contacting the microelectronic device with an aqueous cleaning composition for sufficient time to at least partially remove said material from the microelectronic device, wherein the aqueous cleaning composition includes at least one corrosion inhibitor, water, optionally at least one chelating agent, optionally at least one etchant, optionally at least one passivating agent, and optionally at least one complexing agent.

In another aspect, a method of removing material from a microelectronic device having said material thereon is described, said method comprising contacting the microelectronic device with an aqueous cleaning composition for sufficient time to at least partially remove said material from the microelectronic device, wherein the aqueous cleaning composition includes at least one corrosion inhibitor, water, at least one etchant, at least one passivating agent, optionally at least one chelating agent, and optionally at least one complexing agent.

Other aspects, features and advantages of the invention will be more fully apparent from the ensuing disclosure and appended claims.

DETAILED DESCRIPTION, AND PREFERRED EMBODIMENTS THEREOF

The present invention generally relates to compositions for removing residue, preferably post-etch residue, more preferably titanium-containing post-etch residue, polymeric sidewall residue, copper-containing via and line residue and/or tungsten-containing post-etch residue from microelectronic devices having said residue thereon, said compositions preferably being compatible with ultra low-k (ULK) ILD materials, such as OSG and porous-CDO, the metallic interconnect materials, e.g., copper and tungsten, the hardmask capping layers, e.g., TiN, and cobalt capping layers, e.g., CoWP, on the microelectronic device surface. Further, the present invention generally relates to methods of removing residue, preferably post-etch residue, more preferably titanium-containing post-etch residue, polymeric sidewall residue, copper-containing via and line residue, tungsten-containing post-etch residue, and/or cobalt-containing post-etch residue, from microelectronic devices having said residue thereon, using compositions, said compositions preferably being compatible with ultra low-k (ULK) ILD materials, the metallic interconnect materials, and the capping layers, on the microelectronic device surface.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the term "microelectronic device" is not meant to be limiting in any way and includes any substrate or structure that will eventually become a microelectronic device or microelectronic assembly. Notably, the microelectronic device substrate may be patterned, blanketed and/or a test substrate.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof.

As defined herein, "low-k dielectric material" and ULK corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. Most preferably, the low-k dielectric material is deposited using organosilane and/or organosiloxane precursors. It is to be appreciated that the low-k dielectric materials may have varying densities and varying porosities.

As defined herein, the term "polymeric sidewall residue" corresponds to the residue that remains on the sidewalls of the patterned device subsequent to post-plasma etching processes. The residue is substantially polymeric in nature however, it should be appreciated that inorganic species, e.g., titanium, silicon, tungsten, cobalt and/or copper-containing species, may be present in the sidewall residue as well.

As used herein, "about" is intended to correspond to ±5% of the stated value.

As used herein, "suitability" for cleaning post-etch residue from a microelectronic device having said residue thereon corresponds to at least partial removal of said residue from the microelectronic device. Preferably, at least about 90% of one or more of the materials, more preferably at least 95% of one or more of the materials, and most preferably at least 99% of one or more of the materials to be removed are removed from the microelectronic device.

"Capping layer" as used herein corresponds to materials deposited over dielectric material and/or metal material, e.g., cobalt, to protect same during the plasma etch step. Hardmask capping layers are traditionally silicon, silicon nitrides, silicon oxynitrides, titanium nitride, titanium oxynitride, titanium, tantalum, tantalum nitride, molybdenum, tungsten, combinations thereof, and other similar compounds. Cobalt capping layers include CoWP and other cobalt-containing materials or tungsten-containing materials.

"Substantially devoid" is defined herein as less than 2 wt. %, preferably less than 1 wt. %, more preferably less than 0.5 wt. %, and most preferably less than 0.1 wt. %.

As used herein, the term "semi-aqueous" refers to a mixture of water and organic components.

As defined herein, "complexing agent" includes those compounds that are understood by one skilled in the art to be complexing agents, chelating agents, sequestering agents, and combinations thereof. Complexing agents will chemically combine with or physically hold the metal atom and/or metal ion to be removed using the compositions described herein.

As defined herein, a "strong base" includes alkali and alkaline earth metal hydroxide salts such as LiOH, NaOH, KOH, RbOH, CsOH, $Mg(OH)_2$, $Ca(OH)_2$, $Sr(OH)_2$ and $Ba(OH)_2$, as well as quaternary ammonium hydroxides having the formula $NR^1R^2R^3R^4OH$, where $R^1$, $R^2$, $R^3$ and $R^4$ are the same as or different from one another and are selected from the group consisting of $C_1$-$C_6$ alkyls, $C_6$-$C_{10}$ aryls, and combinations thereof.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

Titanium-containing post-etch residue materials are notoriously difficult to remove using the ammonia-containing compositions of the prior art. The present inventors discovered a cleaning composition that is substantially devoid of ammonia and/or strong bases (e.g., NaOH, KOH, etc.) and preferably, substantially devoid of oxidizing agents, which effectively and selectively removes titanium-containing residues from the surface of a microelectronic device having same thereon. In addition, the composition will substantially remove polymeric sidewall residue, copper-containing residue, cobalt-containing residue, and/or tungsten-containing residue without substantially damaging the underlying ILD, metal interconnect materials, e.g., Cu, Al, Co and W, and/or the capping layers. Further, the compositions may be used regardless of whether the trench or via is etched first (i.e., a trench-first or via-first scheme). Further, the composition can be formulated to substantially remove TiN layers from the surface of a microelectronic device having same thereon.

In a first aspect, the cleaning compositions described herein are aqueous or semi-aqueous and include at least one corrosion inhibitor, water, optionally at least one etchant source, optionally at least one metal-chelating agent, optionally at least one complexing agent, and optionally at least one passivating agent, for removing post-plasma etch residues from the surface of a microelectronic device having same thereon, wherein the post-plasma etch residue comprises a species selected from the group consisting of titanium-containing residues, polymeric residues, copper-containing residues, tungsten-containing residues, cobalt-containing residues, and combinations thereof. In another embodiment, the cleaning compositions described herein include at least one corrosion inhibitor, water, at least one etchant source, optionally at least one metal-chelating agent, optionally at least one complexing agent, and optionally at least one passivating agent. In still another embodiment, the cleaning compositions include at least one corrosion inhibitor, water, at least one metal-chelating agent, optionally at least one etchant source, optionally at least one complexing agent, and optionally at least one passivating agent. In still another embodiment, the cleaning compositions include at least one corrosion inhibitor, water, at least one complexing agent, optionally at least one etchant source, optionally at least one passivating agent, and optionally at least one metal-chelating agent. In another embodiment, the cleaning compositions include at least one corrosion inhibitor, water, at least one passivating agent, optionally at least one metal-chelating agent, optionally at least one complexing agent, and optionally at least one etchant source. In another embodiment, the cleaning compositions include at least one corrosion inhibitor, water, at least one etchant source, at least one metal-chelating agent, optionally at least one passivating agent, and optionally at least one complexing agent. In yet another embodiment, the cleaning compositions include at least one corrosion inhibitor, water, at least one etchant source, at least one complexing agent, optionally at least one passivating agent, and optionally at least one metal-chelating agent. In another embodiment, the cleaning compositions include at least one corrosion inhibitor, water, at least one complexing agent, at least one metal-chelating agent, optionally at least one passivating agent, and optionally at least one etchant source. In another embodiment, the cleaning compositions include at least one corrosion inhibitor, water, at least one etchant source, at least one passivating agent, optionally at least one complexing agent, and optionally at least one metal-chelating agent. In still another embodiment, the cleaning compositions include at least one corrosion inhibitor, water, at least one complexing agent, at least one metal-chelating agent, and at least one etchant source. Preferably, the amount of water present is in a range from about 50 wt % to about 99 wt %, based on the total weight of the composition. In each embodiment, at least one surfactant, a source of silica, and/or at least one organic solvent may be added.

In one embodiment, the aqueous composition for cleaning post-plasma etch residues selected from the group consisting of titanium-containing residues, polymeric residues, copper-containing residues, tungsten-containing residues, cobalt-containing residues, and combinations thereof, includes at least one corrosion inhibitor, water, optionally at least one etchant, optionally at least one metal chelating agent, optionally at least one passivating agent, and optionally at least one complexing agent, present in the following ranges, based on the total weight of the composition.

| component | % by weight |
| --- | --- |
| corrosion inhibitor(s) | about 0.01% to about 20% |
| water | about 50% to about 97% |
| etchant source(s) | 0% to about 50 wt. % |
| chelating agent(s) | 0% to about 10% |
| passivating agent(s) | 0 to about 5% |
| complexing agent(s) | 0 to about 10% |
| surfactant(s) | 0 to about 10% |
| organic solvent(s) | 0 to about 10% |

In the broad practice, the cleaning composition may comprise, consist of, or consist essentially of: (i) at least one corrosion inhibitor, water, optionally at least one etchant source, optionally at least one metal-chelating agent, optionally at least one passivating agent, and optionally at least one complexing agent; (ii) at least one corrosion inhibitor, water, at least one etchant source, optionally at least one metal-chelating agent, optionally at least one passivating agent, and optionally at least one complexing agent; (iii) at least one corrosion inhibitor, water, at least one metal-chelating agent, optionally at least one etchant source, optionally at least one passivating agent, and optionally at least one complexing agent; (iv) at least one corrosion inhibitor, water, at least one complexing agent, optionally at least one etchant source, optionally at least one passivating agent, and optionally at least one metal-chelating agent; (v) at least one corrosion inhibitor, water, at least one etchant source, at least one metal-chelating agent, optionally at least one passivating agent and optionally at least one complexing agent; (vi) at least one corrosion inhibitor, water, at least one etchant source, at least one complexing agent, optionally at least one passivating agent and optionally at least one metal-chelating agent; (vii) at least one corrosion inhibitor, water, at least one complexing agent, at least one metal-chelating agent, optionally at least one passivating agent and optionally at least one etchant source; (viii) at least one corrosion inhibitor, water, at least one complexing agent, at least one metal-chelating agent, and at least one etchant source; (ix) at least one corrosion inhibitor, water, at least one passivating agent, optionally at least one metal-chelating agent, optionally at least one complexing agent, and optionally at least one etchant source; (x) at least one corrosion inhibitor, water, at least one etchant source, at least one passivating agent, optionally at least one complexing agent, and optionally at least one metal-chelating agent.

The water is included to serve as a solvent and assist in the dissolution of residues, e.g., water-soluble copper oxide residues. The water is preferably deionized.

In a preferred embodiment, the aqueous cleaning composition is substantially devoid of oxidizing agents such as peroxide-containing compounds and nitric acid. In another preferred embodiment, the aqueous cleaning composition is substantially devoid of abrasive material prior to contact with the substrate to be cleaned.

The pH range of the aqueous cleaning composition is about 0 to about 7, preferably about 0 to about 5, even more preferably about 0 to about 4, and most preferably about 0 to about 3.

The etchant sources assist in breaking up and solubilizing the post-etch residue species, aiding in polymer sidewall residue removal and slightly etching of the TiN hardmask. Etchant sources contemplated herein include, but are not limited to: hydrofluoric acid (HF); fluorosilicic acid ($H_2SiF_6$); fluoroboric acid; ammonium fluorosilicate salt (($NH_4$)$_2SiF_6$); tetramethylammonium hexafluorophosphate; ammonium fluoride salts; ammonium bifluoride salts; quaternary ammonium tetrafluoroborates and quaternary phosphonium tetrafluoroborates having the formula $NR_4BF_4$ and $PR_4BF_4$, respectively, wherein R may be the same as or different from one another and is selected from the group consisting of hydrogen, straight-chained, branched, or cyclic $C_1$-$C_6$ alkyl (e.g., methyl, ethyl, propyl, butyl, pentyl, hexyl), and straight-chained or branched $C_6$-$C_{10}$ aryl (e.g., benzyl); tetrabutylammonium tetrafluoroborate (TBA-$BF_4$); propylene glycol/HF in a weight ratio of about 90:10 to about 99:1, preferably about 93:7 to about 98:2; propylene glycol/tetraalkylammonium fluoride, where the alkyl groups may be the same as or different from one another and are selected from the group consisting of straight chained or branched $C_1$-$C_6$ alkyl groups (e.g., methyl, ethyl, propyl, butyl, pentyl, hexyl), in a weight ratio of about 75:25 to about 95:5, preferably about 80:20 to about 90:10; propylene glycol/tetrabutylammonium fluoride in a weight ratio of about 75:25 to about 95:5, preferably about 80:20 to about 90:10; propylene glycol/benzyltrimethylammonium fluoride in a weight ratio of about 75:25 to about 95:5, preferably about 80:20 to about 90:10; and combinations thereof. Preferably, the etchant source comprises ammonium bifluoride, quaternary ammonium tetrafluoroborates (e.g., tetramethylammonium tetrafluoroborate, tetraethylammonium tetrafluoroborate, tetrapropylammonium tetrafluoroborate, tetrabutylammonium tetrafluoroborate), quaternary phosphonium tetrafluoroborates, or combinations thereof. Preferably, the etchant source comprises ammonium bifluoride, tetrabutylammonium tetrafluoroborate, or a combination thereof. It should be appreciated by the skilled artisan that quaternary ammonium tetrafluoroborates and quaternary phosphonium tetrafluoroborates may be generated in situ.

The organic solvents, when present, assist in solubilization of the components of the aqueous cleaning composition and organic residues, wet the surface of the microelectronic device structure to facilitate residue removal, prevent residue redeposition, and/or passivate the underlying materials, e.g., ULK. Organic solvents contemplated herein include, but are not limited to, alcohols, ethers, pyrrolidinones, glycols, amines, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran (THF), N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, 1,4-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, dibasic ester, glycerine carbonate, N-formyl morpholine, triethyl phosphate, and combinations thereof. In addition, the organic solvent may comprise other amphiphilic species, i.e., species that contain both hydrophilic and hydrophobic moieties similar to surfactants. Hydrophobic properties may generally be imparted by inclusion of a molecular group consisting of hydrocarbon or fluorocarbon groups and the hydrophilic properties may generally be imparted by inclusion of either ionic or uncharged polar functional groups. Preferably, the organic solvent includes tripropylene glycol methyl ether (TPGME), dipropylene glycol methyl ether (DPGME), propylene glycol, and combinations thereof. When present, the composition includes at least 0.01 wt % organic solvent, based on the total weight of the composition.

The metal corrosion inhibitors serve to eliminate overetching of metals, e.g., copper, tungsten, and/or cobalt interconnect metals. Suitable corrosion inhibitors include, but are not limited to, azoles such as benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenylbenzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 5-amino-1,3,4-thiadiazole-2-thiol, benzothiazole, tritolyl phosphate, indazole, DNA bases (e.g., adenine, cytosine, guanine, thymine), phosphate inhibitors, amines, pyrazoles, iminodiacetic acid (IDA), propanethiol, silanes, secondary amines, benzohydroxamic acids, heterocyclic nitrogen inhibitors, citric acid, ascorbic acid, thiourea, 1,1,3,3-tetramethylurea, urea, urea derivatives, uric acid, potassium ethylxanthate, glycine, dodecylphosphonic acid (DDPA), and mixtures thereof. Dicarboxylic acids such as oxalic acid, malonic acid, succinic acid, nitrilotriacetic acid, and combinations thereof are also useful copper passivator species. It is generally accepted that azoles chemisorb onto the copper surface and form an insoluble cuprous surface complex. Suitable tungsten corrosion inhibitor include, but are not limited to, sulfolane, 2-mercaptothiazoline, 2,3,5-trimethylpyrazine, 2-ethyl-3,5-dimethylpyrazine, quinoxaline, acetyl pyrrole, pyridazine, histidine, pyrazine, glycine, benzimidazole, benzotriazole (BTA), iminodiacetic acid (IDA), glutathione (reduced), cysteine, 2-mercaptobenzimidazole, cystine, thiophene, mercapto pyridine N-oxide, thiamine HCl, tetraethyl thiuram disulfide, 1,2,4-triazole, 2,5-dimercapto-1,3-thiadiazoleascorbic acid, ascorbic acid, and combinations thereof, preferably sulfolane, pyrazine, glycine, histidine, ascorbic acid, and combinations thereof. Preferably, the corrosion inhibitor includes BTA, TAZ, 5-amino-1,3,4-thiadiazol-2-thiol, dodecylphosphonic acid, a combination of BTA and TAZ or any other combination thereof. When present, the composition includes at least 0.01 wt % corrosion inhibitor, based on the total weight of the composition.

The inclusion of the chelating agent serves to chelate the oxidized copper and/or tungsten metals in the post-etch residue species and/or react with TiN and/or titanium-containing residues. Suitable chelating agents include, but are not limited to: fluorinated β-diketone chelating agents such as 1,1,1,5,5,5-hexafluoro-2,4-pentanedione (hfacH), 1,1,1-trifluoro-2,4-pentanedione (tfac), and acetylacetonate (acac); iminodiacetic acid; pyrazolates; amidinates; guanidinates; ketoimines; dienes; polyamines; ethylenediaminetetraacetic acid (EDTA); 1,2-cyclohexanediamine-N,N,N',N'-tetraacetic acid (CDTA); etidronic acid; methanesulfonic acid; hydrochloric acid; acetic acid; acetylacetone; alkylamines; arylamines; glycolamines; alkanolamines; triazoles; thiazoles; tetrazoles; imidazoles; 1,4-benzoquinone; 8-hydroxyquinoline; salicylidene aniline; tetrachloro-1,4-benzoquinone; 2-(2-hydroxyphenyl)-benzoxazol; 2-(2-hydroxyphenyl)-benzothiazole; hydroxyquinoline sulfonic acid (HQSA); sulfosalicylic acid (SSA); salicylic acid (SA); tetramethylammonium halides, e.g., fluoride, chloride, bromide, iodide; and amines and amine-N-oxides including, but not limited to, pyridine, 2-ethylpyridine, 2-methoxypyridine and derivatives thereof such as 3-methoxypyridine, 2-picoline, pyridine derivatives, dimethylpyridine, piperidine, piperazine, triethylamine, triethanolamine, ethylamine, methylamine, isobutylamine, tert-butylamine, tributylamine, dipropylamine, dimethylamine, diglycol amine, monoethanolamine, methyldiethanolamine, pyrrole, isoxazole, 1,2,4-triazole, bipyridine, pyrimidine, pyrazine, pyridazine, quinoline, isoquinoline, indole, imidazole, N-methylmorpholine-N-oxide (NMMO), trimethylamine-N-oxide, triethylamine-N-oxide, pyridine-N-oxide, N-ethylmorpholine-N-oxide, N-methylpyrrolidine-N-oxide, N-ethylpyrrolidine-N-oxide, 1-methylimidazole, diisopropylamine, diisobutylamine, aniline, aniline derivatives, pentamethyldiethylenetriamine (PMDETA), and combinations of any of the above. Preferably, the chelating agent is methanesulfonic acid, hydrochloric acid, PMDETA, and combinations thereof. When present, the composition includes at least 0.01 wt % chelating agent, based on the total weight of the composition.

The complexing agents preferably have a high affinity for aluminum-containing residues. Complexing agents contemplated include, but are not limited to, aminocarboxylic acids, organic acids and derivatives thereof, phosphonic acids and derivatives thereof, and combinations thereof including: butylenediaminetetraacetic acid, diethylenetriaminepentaacetic acid (DTPA), ethylenediaminetetrapropionic acid, (hydroxyethyl)ethylenediaminetriacetic acid (HEDTA), N,N,N',N'-ethylenediaminetetra(methylenephosphonic)acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), nitrilotris(methylene)triphosphonic acid, diethylenetriaminepenta(methylenephosphonic acid) (DETAP), aminotri(methylenephosphonic acid), 1-hydroxyethylidene-1,1-diphosphonic acid (HEDP), bis(hexamethylene) triamine phosphonic acid, 1,4,7-triazacyclononane-N,N',N''-tris(methylenephosphonic acid) (NOTP), 2-phosphonobutane-1,2,4-tricarboxylic acid, nitrilotriacetic acid (NTA), citric acid, tartaric acid, gluconic acid, saccharic acid, glyceric acid, oxalic acid, phthalic acid, maleic acid, mandelic acid, malonic acid, lactic acid, dihydroxybenzoic acid, catechol, gallic acid, propyl gallate, pyrogallol, cysteine, dihydroxysalicylic acid, glyphosate, N-(Phosphonomethyl)-iminodiacetic acid, formic acid, propanoic acid, butanoic acid, sulfate ions, N-(2-Hydroxyethyl)-iminodiacetic acid, pyridine-2,5-dicarboxylic acid, pyridine-2,6-dicarboxylic acid, 7-Iodo-8-hydroxyquinoline-5-sulfonic acid, 2-amino-2-propylphosphonic acid, 1,2-dihydroxybenzene-4-sulfonic acid, 4,5-dihydroxy-1,3-benzene disulfonic acid (Tiron), solochrome violet R, 3-hydroxy-2-naphthoic acid, chromotropic acid, nitroacetic acid, oxydiacetic acid, thiodiacetic acid, 8-hydroxy-7-(arylazo)-quinoline-5-sulfonic acid, 2-oxobutanoic acid, acetoacetic acid, phenylserine, L-ascorbic acid, squaric acid, acetohydroxamic acid, 3-hydroxy-5,7-disulfo-2-naphthoic acid, 2,3-dihydroxynaphthalene-6-sulfonic acid, sulfoxine, oxine, succinic acid, 3,4-dihydroxybenzoic acid, 2-(3,4-dihydroxyphenyl)-2-(1,1-benzopyran)-3,5,7-triol, 3-hydroxy-7-sulfo-2-naphthoic acid, 1,2-dihydroxynaphthalene-4-sulfonic acid, N,N-bis(2-hydroxyethyl)glycine, N-(phosphonomethyl)-iminodiacetic acid, iminobis(methylenephosphonic acid), D-gluconic acid, tartaric acid, 1-oxopropane-1,2-dicarboxylic acid, propane-1,2,3-tricarboxylic acid, N,N',N''-tris[2-(N-hydroxycarbamoyl)ethyl]-1,3,5-benzenetricarboxamide (BAMTPH), desferriferrioxamine-B, 1,7-dihydroxy-4-sulfo-2-naphthanoic acid, aspartic acid, glutamic acid, pyridoxal-5-(dihydrogenphosphate), pyridoxal, amino(phenyl)methylene-diphosphoric acid, ethylene glycol tetraacetic acid (EGTA), ethylenebis(imino-(2-hydroxyphenyl)methylene(methyl)-phosphonic acid)), N-(2-hydroxyethyl)-ethylenedinitrilo-N,N',N'-triacetic acid, trimethylenedinitrilotetracetic acid, (2-dihydroxytrimethylene)-dinitrilotetracetic acid, xylenol orange, methylthymol blue, 3-hydroxyglutamic acid, L-phosphoserine, DL-amino-3-phosphopropanoic acid, and combinations thereof.

The compositions may optionally further include a surfactant to assist in residue removal, wet the surface, and/or prevent residue redeposition. Illustrative surfactants include, but are not limited to, amphoteric salts, cationic surfactants, anionic surfactants, fluoroalkyl surfactants, SURFONYL® 104, TRITON® CF-21, ZONYL® UR, ZONYL® FSO-100, ZONYL® FSN-100, 3M Fluorad fluorosurfactants (i.e., FC-4430 and FC-4432), dioctylsulfosuccinate salt, 2,3-dimercapto-1-propanesulfonic acid salt, dodecylbenzenesulfonic acid, polyethylene glycols, polypropylene glycols, polyethylene or polypropylene glycol ethers, carboxylic acid salts, $R_1$ benzene sulfonic acids or salts thereof (where the $R_1$ is a straight-chained or branched $C_8$-$C_{18}$ alkyl group), amphiphilic fluoropolymers, polyethylene glycols, polypropylene glycols, polyethylene or polypropylene glycol ethers, carboxylic acid salts, dodecylbenzenesulfonic acid, polyacrylate polymers, dinonylphenyl polyoxyethylene, silicone or modified silicone polymers, acetylenic diols or modified acetylenic diols, alkylammonium or modified alkylammonium salts, as well as combinations comprising at least one of the foregoing surfactants, sodium dodecyl sulfate, zwitterionic surfactants, aerosol-OT (AOT) and fluorinated analogues thereof, alkyl ammonium, perfluoropolyether surfactants, 2-sulfosuccinate salts, phosphate-based surfactants, sulfur-based surfactants, and acetoacetate-based polymers. When present, the composition includes at least 0.01 wt % surfactant, based on the total weight of the composition.

The compositions may further include a source of silica. The silica may be added to the composition as a fine silica powder, or as a tetraalkoxysilane such as TEOS, preferably at a ratio of etchant to silica source of about 4:1 to about 5:1. In a particularly preferred embodiment, the etchant source is fluorosilicic acid and the silica source is TEOS. The preferred embodiment further includes a glycol based solvent to facilitate the dissolution of the silica source in the composition. When present, the composition includes at least 0.01 wt % silica, based on the total weight of the composition.

The low-k passivating agents may be included to reduce the chemical attack of the low-k layers and to protect the wafer from additional oxidation. Boric acid is a presently preferred low-k passivating agent, although other hydroxyl additives may also be advantageously employed for such purpose, e.g., 3-hydroxy-2-naphthoic acid, malonic acid, iminodiacetic acid, and mixtures thereof. Preferably, the low-k passivating agent comprises iminodiacetic acid, boric acid, or a combination Thereof. When present, the composition includes at least 0.01 wt % low-k passivating agent, based on the total weight of the composition. Preferably, less than 2 wt. % of the underlying low-k material is etched/removed using the removal compositions described herein, more preferably less than 1 wt. %, most preferably less than 0.5 wt. %, based on the total weight of the underlying low-k material.

In a particularly preferred embodiment, the aqueous composition comprises, consists of, or consists essentially of BTA, TAZ, ammonium bifluoride, boric acid, and water. In another particularly preferred embodiment, the aqueous composition comprises, consists of, or consists essentially of BTA, TAZ, ammonium bifluoride, tetrabutylammonium tetrafluoroborate, boric acid, and water. In still another particularly preferred embodiment, the aqueous composition comprises, consists of, or consists essentially of ammonium bifluoride, boric acid, dodecylphosphonic acid, and water.

The aqueous compositions described herein are preferably devoid of abrasive material (e.g., silica, alumina, other abrasives used during chemical mechanical polishing processes), oxidizing agents, ammonia, strong bases, and an amidoxime complexing agent. Although disclosed as an optional component, most preferably the aqueous compositions are substantially devoid of organic solvents and silica sources.

In another embodiment, the aqueous compositions described herein further include post-plasma etch residue, wherein the post-plasma etch residue comprises residue material selected from the group consisting of titanium-containing residue, polymeric-residue, copper-containing residue, tungsten-containing residue, cobalt-containing residue, and combinations thereof. The residue material may be dissolved and/or suspended in the aqueous compositions.

In still another embodiment, the aqueous compositions described herein further include titanium nitride material. The TiN material may be dissolved and/or suspended in the aqueous compositions.

In one embodiment, the compositions are useful for the selective removal of TiN, sidewall residue, and/or post-etch residue without substantially etching patterned or blanket tungsten layers, copper layers and/or ULK layers. In another embodiment, the compositions are useful for the selective removal of sidewall residue, and/or post-etch residue without substantially etching patterned or blanket tungsten layers, TiN, copper layers and/or ULK layers.

In addition to a liquid solution, it is also contemplated herein that the compositions of both aspects of the invention may be formulated as foams, fogs, subcritical or supercritical fluids (i.e., wherein the solvent is $CO_2$, etc., instead of water).

Advantageously, the cleaning compositions described herein effectively remove post-plasma etch residue from the top surface, the sidewalls, and the vias and lines of the microelectronic device without compromising the ILD, capping layers, and/or the metal interconnect layers present on the device. In addition, the compositions may be used regardless of whether the trench or the via is etched first.

It will be appreciated that in general cleaning applications, it is common practice to make highly concentrated forms to be used at extreme dilutions. For example, the cleaning compositions may be manufactured in a more concentrated form, including at least about 20 wt % water for solubility purposes, and thereafter diluted with additional solvent (e.g., water and/or organic solvent) at the manufacturer, before use, and/or during use at the fab. Dilution ratios may be in a range from about 0.1 part diluent:1 part removal composition concentrate to about 100 parts diluent:1 part removal composition concentrate. It is understood that upon dilution, the weight percent ratios of many of the components of the removal composition will remain unchanged.

The compositions described herein are easily formulated by simple addition of the respective ingredients and mixing to homogeneous condition. Furthermore, the compositions may be readily formulated as single-package formulations or multi-part formulations that are mixed at the point of use, preferably multi-part formulations. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. Preferably, the kit includes, in one or more containers, the preferred combination of at least one corrosion inhibitor, optionally water, optionally at least one etchant, optionally at least one chelating agent, optionally at least one passivating agent, and optionally at least one complexing agent, for combining with water at the fab or the point of use. The containers of the kit must be suitable for storing and shipping said cleaning composition components, for example, NOWPak® containers (Advanced Technology Materials, Inc., Danbury, Conn., USA). The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Publication No. 20100128555 entitled "SYSTEMS AND METHODS FOR MATERIAL BLENDING AND DISTRIBUTION" published on May 27, 2010 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

As applied to microelectronic manufacturing operations, the cleaning compositions are usefully employed to clean post-plasma etch residue from the surface of the microelectronic device, and may be applied to said surface before or after the application of other compositions formulated to remove alternative materials from the surface of the device. The compositions described herein do not damage ILD materials on the device surface and preferably remove at least 90% of the residue present on the device prior to removal processing, more preferably at least 95%, and most preferred at least 99% of the residue to be removed is removed.

In post-plasma etch residue removal application, the composition may be applied in any suitable manner to the device to be cleaned, e.g., by spraying the composition on the surface of the device to be cleaned, by dipping the device to be cleaned in a static or dynamic volume of the composition, by contacting the device to be cleaned with another material, e.g., a pad, or fibrous sorbent applicator element, that has the composition absorbed thereon, or by any other suitable means, manner or technique by which the composition is brought into removal contact with the device to be cleaned. Further, batch or single wafer processing is contemplated herein.

In use of the compositions for removing post-plasma etch residue from microelectronic devices having same thereon, the composition typically is statically or dynamically contacted with the device for a time of from about 1 minute to about 30 minutes, preferably about 1 minute to 10 minutes, at temperature in a range of from about 20° C. to about 90° C., preferably about 40° C. to about 70° C., and most preferably about 50° C. to about 60° C. Preferably, the contacting is static. Such contacting times and temperatures are illustrative, and any other suitable time and temperature conditions may be employed that are efficacious to at least partially remove the post-etch residue material from the device. "At least partial removal" of the residue material from the microelectronic device corresponds to at removal of at least 90% of the material, preferably at least 95% removal. Most preferably, at least 99% of said residue material is removed using the compositions described herein.

Following the achievement of the desired removal action, the compositions may be readily removed from the device to which it has previously been applied, e.g., by rinse, wash, or other removal step(s), as may be desired and efficacious in a given end use application of the compositions described herein. For example, the device may be rinsed with a rinse solution including deionized water and/or dried (e.g., spin-dry, $N_2$, vapor-dry etc.).

When necessary, a post-clean bake step and/or an isopropanol vapor-dry step may be necessary to remove non-volatile materials that may absorb into the pores of the ILD materials so as not to change the capacitance of the low-k dielectric materials.

Another aspect relates to the improved microelectronic devices made according to the methods described herein and to products containing such microelectronic devices.

A still further aspect relates to methods of manufacturing an article comprising a microelectronic device, said method comprising contacting the microelectronic device with a composition for sufficient time to clean post-plasma etch residue from the microelectronic device having said residue thereon, and incorporating said microelectronic device into said article, wherein the composition includes at least one corrosion inhibitor, water, optionally at least one chelating agent, optionally at least one etchant, optionally at least one passivating agent, and optionally at least one complexing agent.

A still further aspect relates to methods of manufacturing an article comprising a microelectronic device, said method comprising contacting the microelectronic device with a composition for sufficient time to clean post-plasma etch residue from the microelectronic device having said residue thereon, and incorporating said microelectronic device into said article, wherein the composition includes at least one corrosion inhibitor, water, optionally at least one chelating agent, optionally at least one etchant, optionally at least one passivating agent, and optionally at least one complexing agent.

In yet another aspect, the compositions described herein may be utilized in other aspects of the microelectronic device manufacturing process, i.e., subsequent to the post-plasma etch residue cleaning step. For example, the compositions may be used to remove post-ash residue and/or they may be diluted and used as a post-chemical mechanical polishing (CMP) clean. Alternatively, the compositions described herein may be used to remove contaminating materials from photomask materials for re-use thereof.

In yet another aspect, an article of manufacture is described, said article comprising a microelectronic device substrate, residue material, and a cleaning composition, wherein the cleaning composition may be any composition described herein, and wherein the residue material is selected from the group consisting of titanium-containing residue, polymeric-residue, copper-containing residue, tungsten-containing residue, cobalt-containing residues, and combinations thereof.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An aqueous cleaning composition, comprising at least one corrosion inhibitor, water, at least one etchant, and at least one passivating agent, wherein the at least one corrosion inhibitor comprises dodecylphosphonic acid, wherein said aqueous cleaning composition is suitable for cleaning post-plasma etch residue from a microelectronic device having said residue thereon.

2. The cleaning composition of claim 1, wherein the post-plasma etch residue comprises residue selected from the group consisting of titanium-containing compounds, polymeric compounds, copper-containing compounds, tungsten-containing compounds, cobalt-containing compounds, and combinations thereof.

3. The cleaning composition of claim 1, wherein the at least one etchant comprises a fluoride species selected from the group consisting of hydrofluoric acid, fluorosilicic acid, fluoroboric acid, ammonium fluorosilicate salt, tetramethylammonium hexafluorophosphate, ammonium fluoride salts, ammonium bifluoride salts, tetrabutylammonium tetrafluoroborate, tetramethylammonium tetrafluoroborate, tetraethylammonium tetrafluoroborate, tetrapropylammonium tetrafluoroborate, tetrabutylammonium tetrafluoroborate, propylene glycol/HF, propylene glycol/tetraalkylammonium fluoride, propylene glycol/benzyltrimethylammonium fluoride, quaternary phosphonium tetrafluoroborates having the formula $PR_4BF_4$, wherein R may be the same as or different from one another and selected from the group consisting of hydrogen, straight-chained $C_1$-$C_6$ alkyl, branched $C_1$-$C_6$ alkyl, cyclic $C_1$-$C_6$ alkyl, straight-chained $C_6$-$C_{10}$ aryl, branched $C_6$-$C_{10}$ aryl, and combinations thereof.

4. The cleaning composition of claim 3, wherein the at least one etchant comprises a fluoride selected from the group consisting of ammonium bifluoride, tetrabutylammonium tetrafluoroborate, quaternary phosphonium tetrafluoroborates, and combinations thereof.

5. The cleaning composition of claim 1, wherein the at least one passivating agent comprises a species selected from the group consisting of boric acid, 3-hydroxy-2-naphthoic acid, malonic acid, iminodiacetic acid, and mixtures thereof.

6. The cleaning composition of claim 1, wherein the at least one passivating agent comprises boric acid.

7. The cleaning composition of claim 1, wherein the at least one corrosion inhibitor further comprises a species selected from the group consisting of benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenylbenzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halo-benzotriazoles (halo=F, Cl, Br, I), naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, phosphate inhibitors, amines, pyrazoles, propanethiol, silanes, secondary amines, benzohydroxamic acids, heterocyclic nitrogen inhibitors, citric acid, ascorbic acid, thiourea, 1,1,3,3-tetramethylurea, urea, urea derivatives, uric acid, potassium ethylxanthate, glycine, iminodiacetic acid, acid, boric acid, malonic acid, succinic acid, nitrilotriacetic acid, sulfolane, 2,3,5-trimethylpyrazine, 2-ethyl-3,5-dimethylpyrazine, quinoxaline, acetyl pyrrole, pyridazine, histadine, pyrazine, glutathione (reduced), cysteine, cystine, thiophene, mercapto pyridine N-oxide, thiamine HCl, tetraethyl thiuram disulfide, 2,5-dimercapto-1,3-thiadiazoleascorbic acid, ascorbic acid, and combinations thereof.

8. The cleaning composition of claim 1, wherein the amount of water is in a range from about 50 wt % to about 99 wt %, based on the total weight of the composition.

9. The cleaning composition of claim 1, wherein the pH is in a range from about 0 to about 7.

10. The cleaning composition of claim 1, wherein the composition is substantially devoid of abrasive material, oxidizing agents, ammonia, strong bases, and amidoxime complexing agents.

11. The cleaning composition of claim 1, wherein the composition is substantially devoid of organic solvent.

12. The cleaning composition of claim 1, wherein the composition is substantially devoid of silica sources.

13. The cleaning composition of claim 1, wherein said composition further comprises post-plasma etch residue selected from the group consisting of titanium-containing residue, polymeric-residue, copper-containing residue, tungsten-containing residue, cobalt-containing residue, and combinations thereof.

14. A method of removing material from a microelectronic device having said material thereon, said method comprising contacting the microelectronic device with an aqueous cleaning composition for sufficient time to at least partially remove said material from the microelectronic device, wherein the aqueous cleaning composition includes at least one corrosion inhibitor, water, at least one etchant, and at least one passivating agent, wherein the at least one corrosion inhibitor comprises dodecylphosphonic acid.

15. The method of claim 14, wherein the material comprises post-plasma etch residue comprising residue selected from the group consisting of titanium-containing compounds, polymeric compounds, copper-containing compounds, tungsten-containing compounds, cobalt-containing compounds, and combinations thereof.

16. The method of claim 14, wherein said contacting comprises conditions selected from the group consisting of: time of from about 1 minute to about 30 minutes; temperature in a range of from about 40° C. to about 70° C.; and combinations thereof.

17. The cleaning composition of claim 1, further comprising at least one surfactant.

18. The method of claim 14, wherein the at least one etchant comprises a fluoride species selected from the group consisting of hydrofluoric acid, fluorosilicic acid, fluoroboric acid, ammonium fluorosilicate salt, tetramethylammonium hexafluorophosphate, ammonium fluoride salts, ammonium bifluoride salts, tetrabutylammonium tetrafluoroborate, tetramethylammonium tetrafluoroborate, tetraethylammonium tetrafluoroborate, tetrapropylammonium tetrafluoroborate, tetrabutylammonium tetrafluoroborate, propylene glycol/HF, propylene glycol/tetraalkylammonium fluoride, propylene glycol/benzyltrimethylammonium fluoride, quaternary phosphonium tetrafluoroborates having the formula $PR_4BF_4$, wherein R may be the same as or different from one another and selected from the group consisting of hydrogen, straight-chained $C_1$-$C_6$ alkyl, branched $C_1$-$C_6$ alkyl, cyclic $C_1$-$C_6$ alkyl, straight-chained $C_6$-$C_{10}$ aryl, branched $C_6$-$C_{10}$ aryl, and combinations thereof.

19. The method of claim 14, wherein the at least one passivating agent comprises a species selected from the group consisting of boric acid, 3-hydroxy-2-naphthoic acid, malonic acid, iminodiacetic acid, and mixtures thereof.

20. The method of claim 14, wherein the at least one corrosion inhibitor further comprises a species selected from the group consisting of benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halo-benzotriazoles (halo=F, Cl, Br, I), naphthotriazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 5-amino-1,3,4-thiadiazole-2-thiol, benzothiazole, tritolyl phosphate, indazole, adenine, cytosine, guanine, thymine, phosphate inhibitors, amines, pyrazoles, propanethiol, silanes, secondary amines, benzohydroxamic acids, heterocyclic nitrogen inhibitors, citric acid, ascorbic acid, thiourea, 1,1,3,3-tetramethylurea, urea, urea derivatives, uric acid, potassium ethylxanthate, glycine, iminodiacetic acid, acid, boric acid, malonic acid, succinic acid, nitrilotriacetic acid, sulfolane, 2,3,5-trimethylpyrazine, 2-ethyl-3,5-dimethylpyrazine, quinoxaline, acetyl pyrrole, pyridazine, histadine, pyrazine, glutathione (reduced), cysteine, cystine, thiophene, mercapto pyridine N-oxide, thiamine HCl, tetraethyl thiuram disulfide, 2,5-dimercapto-1,3-thiadiazoleascorbic acid, and combinations thereof.

* * * * *

UNITED STATES PATENT AND TRADEMARK OFFICE
CERTIFICATE OF CORRECTION

PATENT NO. : 9,063,431 B2
APPLICATION NO. : 13/810060
DATED : June 23, 2015
INVENTOR(S) : Jeffrey A. Barnes et al.

It is certified that error appears in the above-identified patent and that said Letters Patent is hereby corrected as shown below:

IN THE CLAIMS

Column 16, Line 31: remove "ascorbic acid,"

Signed and Sealed this
Tenth Day of November, 2015

Michelle K. Lee
*Director of the United States Patent and Trademark Office*